United States Patent
Yuh

(10) Patent No.: US 9,999,867 B2
(45) Date of Patent: Jun. 19, 2018

(54) COMPOSITE ADSORBENT MATERIAL

(71) Applicant: Howard Y. Yuh, Yardley, PA (US)

(72) Inventor: Howard Y. Yuh, Yardley, PA (US)

( * ) Notice: Subject to any disclaimer, the term of this patent is extended or adjusted under 35 U.S.C. 154(b) by 0 days. days.

(21) Appl. No.: 15/637,380

(22) Filed: Jun. 29, 2017

(65) Prior Publication Data

US 2018/0001295 A1    Jan. 4, 2018

Related U.S. Application Data

(60) Provisional application No. 62/356,126, filed on Jun. 29, 2016.

(51) Int. Cl.

| | |
|---|---|
| *B01J 20/02* | (2006.01) |
| *B01J 20/20* | (2006.01) |
| *B01J 20/04* | (2006.01) |
| *B01J 20/28* | (2006.01) |
| *B01J 20/283* | (2006.01) |

(52) U.S. Cl.
CPC ............ *B01J 20/20* (2013.01); *B01J 20/046* (2013.01); *B01J 20/283* (2013.01); *B01J 20/28004* (2013.01); *B01J 20/28014* (2013.01); *B01D 2253/102* (2013.01); *B01D 2253/106* (2013.01)

(58) Field of Classification Search
CPC ......... B01J 20/20; B01J 20/046; B01J 20/283
See application file for complete search history.

(56) References Cited

U.S. PATENT DOCUMENTS

| | | | | |
|---|---|---|---|---|
| 5,569,534 | A * | 10/1996 | Lambotte ................. | B01J 20/20 428/402 |
| 8,962,520 | B2 * | 2/2015 | Tso ........................ | B01J 20/046 502/416 |

OTHER PUBLICATIONS

C.A. Schlosser et.al., "The Future of Global Water Stress: An Integrated Assessment," MIT, Cambridge, MA, MIT Joint Program on the Science and Policy of Global Change 254, 2014.
O.K. Buros, The ABCs of Desalting.: International Desalination Association, 2000.
O.A. Hamed, "Overview of hybrid desalination systems—current status and future prospects," Saline Water Conversion Corporation (SWCC), Al-Jubail, Saudi Arabia, 2004.
M.T. Ali et.al., "A comprehensive techno-economical review of indirect solar desalination,"; Renewable and Sustainable Energy Reviews, vol. 15, pp. 4187-4199, 2011.
J. E. Miller, "Review of Water Resources and desalination technologies," Sandia National Laboratories, Albuquerque, New Mexico, SAND Report 2003-0800, 2003.
S. Chaudhry. (Oct. 2012) New and Emerging Desalination. http://www.iapws.org/minutes/2012/Symp-Chaudhry.pdf, 2012.
J. Tonner, "Barriers to thermal desalination in the United States," U.S. Department of the Interior Bureau of Reclamation, Denver, CO, Desalination and Water Purification Research and Development Program Report 144, 2008.
Carlsbad Desalination Project, "Energy minimization and greenhouse gas reduction plan," San Diego,CA, 2008.

* cited by examiner

*Primary Examiner* — Stuart Hendrickson
(74) *Attorney, Agent, or Firm* — Meagher Emanuel Laks Goldberg & Liao, LLP

(57) ABSTRACT

Disclosed is a composite adsorbent material comprising three components, including a porous media, a hygroscopic material, and graphite flakes. Among the many different possibility considered, it may be advantageous for the porous media to be mesoporous silica or the hygroscopic materials to be calcium chloride, lithium bromide, or lithium chloride. It is considered that the graphite flakes may comprise 50 percent or less of the graphite flake-hygroscopic material composition, and certain embodiments may utilize between 15 and 30 percent graphite in the graphite flake-hygroscopic material composition. It is still further considered that the graphite flakes may advantageously be less than 300 microns in size, or may have an average number of carbon planes that is 100 or less. Additional materials may also be incorporated, including biologics, polymers, and catalysts.

9 Claims, 1 Drawing Sheet

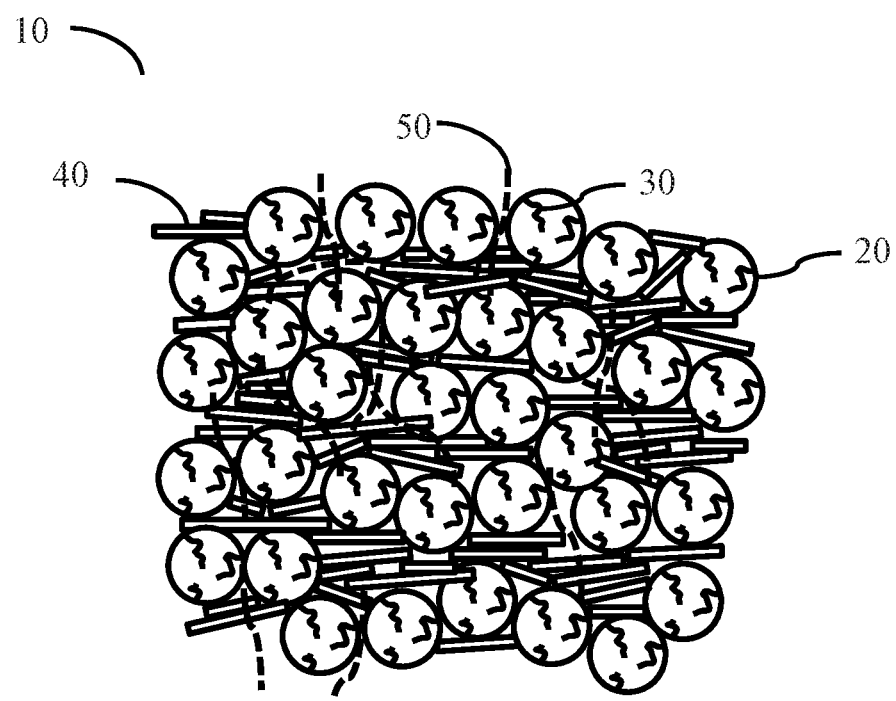

COMPOSITE ADSORBENT MATERIAL

CROSS-REFERENCE TO RELATED APPLICATIONS

This application claims benefit of U.S. Patent Application No. 62/356,126, filed Jun. 29, 2016, which is hereby incorporated in its entirety by reference.

BACKGROUND

Adsorption heat pumps based on silica gel have been studied for many years. However, one of the major difficulties with any silica gel based system has been inefficient heat transfer due to the low thermal conductivity of silica gel. The heat of adsorption has a value within 5-10% of the heat of vaporization, and can quickly raise the temperature of the adsorbent and slow or stop the adsorption process if not effectively removed. Previous attempts have used clay binders, waterglass, and conductive epoxies to thermally couple the silica gel with expensive extended metal heat sink structures. However, to date, no simple, inexpensive solution has been developed to allow use with, for example, devices that rely on small temperature differentials, where the adsorbent temperature cannot elevate significantly during adsorption.

SUMMARY OF THE INVENTION

The present invention is drawn to a composite adsorbent material. The composite material generally comprises three components, including a porous media, a hygroscopic material, and graphite flakes. Among the many different possibility considered, it may be advantageous for the porous media to be mesoporous silica or the hygroscopic materials to be calcium chloride, lithium bromide, or lithium chloride. It is considered that the graphite flakes may comprise 50 percent or less of the graphite flake-hygroscopic material composition, and certain embodiments may utilize between 15 and 30 percent graphite in the graphite flake-hygroscopic material composition. It is still further considered that the graphite flakes may advantageously be less than 300 microns in size, or may have an average number of carbon planes that is 100 or less. Additional materials may also be incorporated, in particular glass fibers and carbon fibers to structurally strengthen the composite adsorbent, but may also include metals, ceramics, biologics, polymers, and catalysts.

BRIEF DESCRIPTION OF THE DRAWINGS

FIG. 1 is a schematic representation of a composite adsorbent material

DETAILED DESCRIPTION OF THE INVENTION

Before the present invention is described in further detail, it is to be understood that the invention is not limited to the particular embodiments described, as such may, of course, vary. It is also to be understood that the terminology used herein is for the purpose of describing particular embodiments only, and is not intended to be limiting, since the scope of the present invention will be limited only by the appended claims.

Where a range of values is provided, it is understood that each intervening value, to the tenth of the unit of the lower limit unless the context clearly dictates otherwise, between the upper and lower limit of that range and any other stated or intervening value in that stated range is encompassed within the invention. The upper and lower limits of these smaller ranges may independently be included in the smaller ranges is also encompassed within the invention, subject to any specifically excluded limit in the stated range. Where the stated range includes one or both of the limits, ranges excluding either or both of those included limits are also included in the invention.

Unless defined otherwise, all technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

It must be noted that as used herein and in the appended claims, the singular forms "a", "an", and "the" include plural referents unless the context clearly dictates otherwise.

Disclosed is a three component adsorbent for use in various adsorbent processes. The first component is an inexpensive industrial nanomaterial, silica gel, which is used as a highly porous matrix for the second component, hygroscopic salt, preferably calcium chloride, lithium bromide, or lithium chloride. A composite of hygroscopic calcium chloride impregnated in the internal pore surfaces of mesoporous silica gel has been studied since its discovery in 1996 by Aristov who called it a Selective Water Sorbent (SWS). Note that there can be some ambiguity in the terminology used to describe the reaction, because while chemical absorption is occurring, reaction kinetics is enhanced by using an adsorbent to increase surface area and vapor transport. As described herein, the words "adsorption" and "adsorbed" are used to describe the reaction. Mesoporous silica gel has an average pore diameter of 8-12 nm with surface areas of about 300-400 $m^2$/gram, but is relatively inexpensive. Particle sizes for these silicas is typically between 1 and 5000 microns, with ground and sifted products more typically between about 10 and about 200 microns. By confining a salt within the silica gel pores, SWS boosts uptake (adsorbed water mass per mass of adsorbent) above the physical adsorption capacity of silica gel. SWS also maintains a solid state with a very large reaction surface area.

The manufacturing processes for producing the above two-component SWS system is well known in the art. An exemplary synthesis procedure for the above two component system generally involves three steps: a host matrix is dried at 120-180 degrees C., the matrix is impregnated with a salt solution, and the water is then removed by heating to 120-150 degrees C.

As this point, expanded graphite can also be introduced. Expanded graphite can be thought of as a graphene precursor, where graphite particles have been sheared apart to a low number of carbon planes. When mixed with silica gel and mechanically compressed, the planar graphite particles align in plane and dramatically improve inter-particle thermal transport in the plane perpendicular to the compression direction by providing high thermal conduction paths between silica grains, increasing the in-plane thermal conductivity to greater than 20 W/(m·K), a several hundred-fold improvement. The improvement in thermal conductivity allows the design of, for example, a greatly simplified adsorption bed using an array of vertical tubes to form a closed-loop boiler that conveys the heat of adsorption between stages using water vapor.

While flakes having a many layers are envisioned, the graphite flakes preferably have an average of 100 layers of carbon planes or less. One embodiment comprises flakes having an average of 100 layers of carbon planes in each flake, or a flake thickness of about 0.034 micron. Another embodiment comprises flakes having an average of 50 layers of carbon planes in each flake. Another embodiment comprises flakes having an average of 25 layers of carbon planes in each flake. Another embodiment comprises flakes having an average of 10-24 layers of carbon planes in each flake. And yet another embodiment comprises flakes having 1 to 9 layers of carbon in each flake.

Additionally, while flakes may be of any dimensions, the graphite flakes are preferably below 300 microns in size (roughly 48 mesh or higher). One embodiment comprises flakes between 180 and 300 microns in size (approximately 48 to 80 mesh). Another embodiment comprises flakes between 150 and 180 microns in size. Another embodiment comprises flakes between 75 and 150 microns. And another embodiment comprises flakes less than 75 microns in size.

As shown in FIG. 1, the basic adsorbent system (10) comprises a porous media (20) with a hygroscopic material (30) impregnated in the pores of the porous media. Expanded graphite flakes (40) are also present, and when the porous media (20) and graphite flakes (40) are combined and compressed, produce a solid form in which the graphite flakes are mostly laying in a preferred plane and interspersed between the porous media. Glass fibers or carbon fibers (50) are also present in a structurally reinforced four component composite.

One manufacturing procedure is as follows. First, expanded graphites are produced by rapid heating expandable graphites, such as sulfuric acid intercalated graphite flakes to high temperatures, such as 600-1000 degrees C. One preferred method of heating is using brief but intense microwave radiation under standard atmospheric conditions, in a partial vacuum, or under any pressure of any single or mixture of inert gas such as carbon dioxide and argon. Due to the large volume and low density of expanded graphite, a slurry is formed for further processing. A slurry of expanded graphite and a compatible dispersion media, which can include but is not limited to methyl, ethyl, and isopropyl alcohols, or water-based solutions with inorganic salts such as ammonium sulfate, sodium sulfate, and potassium sulfate, or water-based surfactant solutions such as Pluronic P-123, sodium dodecyl sulphate, or poly(sodium 4-styrenesulfonate), and any mixtures from this list. Slurries, generally utilizing around 10 to 100 ml of dispersion media per gram of expanded graphite, is then subjected to high shear mixing and ultrasonication to fully separate the expanded graphite layers. The slurry is then vacuum-filtered to remove excess dispersion media for recycling back into slurry, leaving approximately 1 ml or less of media per gram of carbon flake. The already prepared SWS, composed of hygroscopic salt impregnated in the pores of silica gel powder, can then be added to the slurry and mixed. The mixture can then be compressed at moderate pressures from 200-1000 psi, and dried, for example at temperatures of 120-150 degrees C. for at least 1-2 hours.

Additionally, while any concentration of graphite is envisioned for the graphite-salt-silica gel composition, compositions comprising 50% or less graphite by weight are preferred. One preferred embodiment comprises between 5-30% graphite by weight. In one embodiment, the composition is ternary, with the salt and silica gel making up the remainder of the weight. However, in another embodiment, the composition is quaternary and also includes at least one fiber, where the fiber is about 5 to about 50 millimeters in length, and about 0.1 to about 10% by weight composition of the adsorbent system, wherein the fiber is comprised to a material selected from the group consisting of a glass fiber having a diameter from about 10 to about 22 micrometers or a carbon fiber between 5 and 10 micrometers in diameter. In other embodiments, additional materials, including but not limited to metals, ceramics, biologics, polymers and/or catalysts to improve other properties such as porosity, structural stability, chemical resistance, cycling stability, and thermal contact reduction.

Thus, a specific composite adsorbent material has been disclosed. It should be apparent, however, to those skilled in the art that many more modifications besides those already described are possible without departing from the inventive concepts herein. The inventive subject matter, therefore, is not to be restricted except in the spirit of the disclosure. Moreover, in interpreting the disclosure, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. An adsorbent composition comprising:
    a first and second porous media particle;
    a hygroscopic material; and
    at least one carbon nanosheet between the first and second porous media particles, the at least one carbon nanosheet having between about 50 and about 100 carbon atom planes in thickness, and having a characteristic diameter of less than 300 microns.

2. The adsorbent composition according to claim 1, wherein the porous media is mesoporous silica gel with characteristic pore sizes between 8 and 12 nanometers.

3. The adsorbent composition according to claim 1, wherein the hygroscopic materials is selected from the group consisting of calcium chloride, lithium bromide, and lithium chloride.

4. The adsorbent composition according to claim 1, wherein the graphite nanosheets comprise 50 percent or less of the total combined weight.

5. The adsorbent composition according to claim 4, wherein the graphite nanosheets comprise between 5 and 30 percent of the combined weight of the graphite nanosheets and hygroscopic material.

6. The adsorbent composition according to claim 1, wherein the carbon nanosheets are between 1 and 300 microns in size.

7. The adsorbent composition according to claim 1, further comprising at least one additional material.

8. The adsorbent composition according to claim 7, wherein the at least one additional material is selected from the group consisting of glass fibers, carbon fibers, metals, ceramics, and polymers.

9. An adsorbent composition comprising:
    a porous media;
    a hygroscopic material;
    a plurality of graphite nanosheets; and
    at least one fiber, where the fiber is between about 5 to about 50 millimeters in length, and between about 0.1 to about 10% by weight composition of the adsorbent composition, wherein the fiber is comprised to a material selected from the group consisting of a glass fiber having a diameter between about 10 and about 22 micrometers and a carbon fiber between 5 and 10 micrometers in diameter.

* * * * *